United States Patent
Kushleyev et al.

(10) Patent No.: US 10,852,364 B2
(45) Date of Patent: Dec. 1, 2020

(54) INTERFERENCE MITIGATION IN MAGNETOMETERS

(71) Applicant: QUALCOMM Incorporated, San Diego, CA (US)

(72) Inventors: Aleksandr Kushleyev, Philadelphia, PA (US); Daniel Warren Mellinger, III, Philadelphia, PA (US); Travis Van Schoyck, Lafayette Hill, PA (US)

(73) Assignee: QUALCOMM Incorporated, San Diego, CA (US)

( * ) Notice: Subject to any disclaimer, the term of this patent is extended or adjusted under 35 U.S.C. 154(b) by 239 days.

(21) Appl. No.: 15/584,576

(22) Filed: May 2, 2017

(65) Prior Publication Data

US 2018/0321328 A1    Nov. 8, 2018

(51) Int. Cl.
| | |
|---|---|
| G01R 33/00 | (2006.01) |
| G01C 17/38 | (2006.01) |
| G01R 33/02 | (2006.01) |
| G01C 17/28 | (2006.01) |
| B64C 39/02 | (2006.01) |

(52) U.S. Cl.
CPC ........ G01R 33/0029 (2013.01); B64C 39/024 (2013.01); G01C 17/28 (2013.01); G01C 17/38 (2013.01); G01R 33/0017 (2013.01); G01R 33/02 (2013.01)

(58) Field of Classification Search
CPC .... G01C 17/38; G01C 17/28; G01R 33/0035; G01R 33/0017; G01R 33/0023; G01R 33/0029; G01R 33/02; G01R 35/005; B64C 39/024
See application file for complete search history.

(56) References Cited

U.S. PATENT DOCUMENTS

| | | | |
|---|---|---|---|
| 8,594,862 | B2 | 11/2013 | Callou et al. |
| 8,717,009 | B2 | 5/2014 | Tu |
| 9,284,049 | B1 | 3/2016 | Wang et al. |
| 2012/0206129 | A1 | 8/2012 | Mahan et al. |
| 2013/0085698 | A1 | 4/2013 | Wade et al. |
| 2013/0200882 | A1* | 8/2013 | Almalki ............ G01R 33/0035 324/202 |

(Continued)

FOREIGN PATENT DOCUMENTS

| | | |
|---|---|---|
| CN | 102589537 B | 1/2016 |
| CN | 205193285 U | 4/2016 |
| EP | 2669626 A1 | 12/2013 |

OTHER PUBLICATIONS

International Search Report and Written Opinion—PCT/US2018/018701—ISA/EPO—dated May 30, 2018.

*Primary Examiner* — Tung X Nguyen
*Assistant Examiner* — Feba Pothen
(74) *Attorney, Agent, or Firm* — Michael F. Taveira (57) ABSTRACT

Various embodiments include devices and methods for mitigating the bias of a magnetometer resulting from operating various hardware components on a device such as a drone or a computing device. Various embodiments may improve the accuracy of magnetometer output by estimating the bias or magnetic interference caused by the hardware components based on a utilization or operating state of each hardware component, and adjusting the magnetometer output to compensate for the estimated bias.

25 Claims, 7 Drawing Sheets

(56) References Cited

U.S. PATENT DOCUMENTS

| | | | |
|---|---|---|---|
| 2014/0074429 A1* | 3/2014 | Chow | G01R 33/0035 |
| | | | 702/154 |
| 2014/0244200 A1 | 8/2014 | Tu | |
| 2014/0278190 A1 | 9/2014 | Brist et al. | |
| 2015/0000145 A1* | 1/2015 | Tu | G01C 17/38 |
| | | | 33/303 |
| 2016/0327389 A1 | 11/2016 | Uzunovic | |
| 2017/0122737 A1* | 5/2017 | Barladeanu | G01C 17/38 |

* cited by examiner

INTERFERENCE MITIGATION IN MAGNETOMETERS

BACKGROUND

Devices that use a magnetometer (essentially an electronic compass) to detect the earth's magnetic field for navigational purposes include Unmanned Aerial Vehicles (UAVs), Autonomous Vehicles (AVs), drones, and robots of every shape and configuration. The magnetometer is typically used to establish a directional heading for the device, such as a UAV, AV, drone, robot, etc., to enable navigation between two geographic points. An accurate heading is important for successful navigation by the device. Because magnetometers are imperfect and the earth's magnetic field varies from location to location, calibration is required to ensure heading accuracy.

The various electrically-powered hardware components of the device, such as a UAV, AV, drone, robot, etc. generate magnetic fields that may influence magnetometer outputs depending on separation distance and the strength of the generated magnetic fields. Typically, the interference to a magnetometer caused by each individual hardware component may be small. However, taken in aggregate, the overall interference experienced by the magnetometer may be sufficient to introduce a bias in the magnetometer's output.

SUMMARY

Various embodiments include methods, and systems and drones including a processor implementing the methods of mitigating bias of a magnetometer generated by hardware components. Various embodiments may include obtaining operation information from hardware components in proximity to the magnetometer, executing a magnetic interference model using the obtained operation information to produce an estimated magnetometer bias, and adjusting an output of the magnetometer based, at least in part, on the estimated magnetometer bias. In some embodiments, obtaining operation information from hardware components in proximity to the magnetometer may include obtaining operation information from hardware components included on the same computing device as the magnetometer. In some embodiments, the computing device may be a drone. In various embodiments, the operation information may include at least one of a utilization measurement, an electrical input, an operating frequency, an operating mode, and a temperature for each of the hardware components.

In some embodiments, the magnetic interference model may include a function of the operation information or a data table correlating magnetic interference to operation information of the hardware components. In some embodiments, generating the magnetic interference model may include measuring changes or bias in the output of the magnetometer resulting from operating or energizing the hardware components across operation levels of the hardware components, and correlating the measured changes or bias in the output of the magnetometer and obtained operation information to produce the magnetic interference model. In some embodiments, the magnetic interference model may be generated prior to initial operation of a computing device including the hardware components and the magnetometer. In some embodiments, the magnetic interference model may be generated during initial operation of a computing device including the hardware components and the magnetometer.

In some embodiments, generating the magnetic interference model may further include measuring changes or bias in the output of the magnetometer resulting from operating or energizing external payload hardware components and the combined changes or bias in the output of the magnetometer resulting from the external payload hardware components and the hardware components in proximity to the magnetometer across operation levels of the external payload hardware components and the hardware components in proximity to the magnetometer. In some embodiments, correlating the measured changes or bias in the output of the magnetometer and the obtained operation information to produce the magnetic interference model may include correlating the measured changes or bias in the output of the magnetometer and the operation levels of the external payload hardware components and the hardware components in proximity to the magnetometer to produce the magnetic interference model. In such embodiments, obtaining operation information from hardware components further may include obtaining operation information from the external payload hardware components.

Various embodiments include a magnetometer system that includes at least one magnetometer and a processor configured with processor-executable instructions to perform operations of the methods summarized above. Various embodiments include a drone that includes at least one magnetometer and a processor configured with processor-executable instructions to perform operations of the methods summarized above. Various embodiments include a drone having a magnetometer and means for performing functions of the methods summarized above.

BRIEF DESCRIPTION OF THE DRAWINGS

The accompanying drawings, which are incorporated herein and constitute part of this specification, illustrate example embodiments, and together with the general description given above and the detailed description given below, serve to explain the features of various embodiments.

DETAILED DESCRIPTION

Various embodiments will be described in detail with reference to the accompanying drawings. Wherever possible, the same reference numbers will be used throughout the drawings to refer to the same or like parts. References made to particular examples and embodiments are for illustrative purposes, and are not intended to limit the scope of the claims.

Various embodiments include methods that may be implemented on a processor of a drone or other computing device with a magnetometer for mitigating the interference on the magnetometer caused by various hardware components. Such hardware components may exhibit electrical currents that generate magnetic fields, which may interfere with (i.e., bias) the output of a magnetometer in proximity to the hardware components. Various embodiments may improve the accuracy of a magnetometer output by estimating the interference or bias caused by individual nearby hardware components, and adjusting the magnetometer output to compensate for the estimated magnetic interference. Various embodiments may further improve the accuracy of navigational headings calculated by a drone or a computing device including a magnetometer by providing a magnetometer bias correction based on the hardware components of the drone or the computing device that are activated.

As used herein, the terms "drone" and "UAV" refer to one of various types of unmanned vehicles. A drone may include an onboard computing device configured to maneuver and/or navigate the drone with or without remote operating instructions (i.e., manually, semi-autonomously, or autonomously), such as from a human operator or remote computing device. Alternatively, the onboard computing device may be configured to maneuver and/or navigate the drone with some remote operating instruction or updates to instructions stored in a memory of the onboard computing device. In some implementations, a drone may be an aerial vehicle propelled for flight using a plurality of propulsion units, each including one or more rotors, that provide propulsion and/or lifting forces for the drone. Drone propulsion units may be powered by one or more types of electric power sources, such as batteries, fuel cells, motor-generators, solar cells, or other sources of electric power, which may also power the onboard computing device, navigation components, and/or other onboard components.

As used herein, the term "computing device" refers to any computing device having an onboard magnetometer. A computing device may be a smartphone, tablet computer, wearable computing device, and the like. Computing devices may also include drones and UAVs.

As used herein, the term "hardware component" refers to a physical electrical or electronic component, circuit, or device that may generate a magnetic field when operating. Examples of hardware components include processors, memories, sensors, radios, data bases, power rails, rectifiers, electric motors, and the like.

As used herein, the term "operation information" refers to characteristics of hardware components that may be obtained by a processor and/or various sensors of a computing device. Operation information may include such operating characteristics as processor utilization levels for one or more processing units, operating frequency of processors, clock speed, electrical current flow, and temperature. Operation information may include those operating characteristics of hardware components, obtained by a processor or sensors, and which may be correlated to magnetic interference on a magnetometer.

Various embodiments include methods, processors executing the methods, and non-transitory processor readable media storing processor-executable instructions for executing the methods for mitigating magnetic interference from hardware components on magnetometers. Various embodiments may use a variety of techniques to generate a magnetic interference model. Magnetic interference models may map hardware component operation information (i.e., operating characteristics) to a bias imposed on a magnetometer, thereby modeling the changes in output of or bias imposed on the magnetometer by individual hardware components as their respective operating levels or states vary as may be reflected in operation information. During drone or computing device operations, the processor of the drone or computing device may obtain operation information from individual hardware components of the drone, such as utilization levels, electrical current demand, clock speed, operating frequency, or temperature of hardware components. The processor of the drone or computing device may execute one or more equations of a magnetic interference model using the obtained operation information as equation inputs to output an estimated magnetometer bias.

Various embodiments may further include adjusting an output of a magnetometer (e.g., the magnetometer of a drone or computing device) based, at least in part, on the estimated magnetometer bias. The adjusted magnetometer output may be a magnetometer reading that compensates for the bias (i.e., magnetic interference) on the magnetometer caused by nearby active hardware components, such as components of a drone or computing device that are active during operations. In some embodiments, the estimated magnetometer bias may be used by a processor of the drone to adjust the output of the magnetometer. In some embodiments, the estimated magnetometer bias may be used by the magnetometer or a processor within the magnetometer to adjust the output provided by the magnetometer to various processors of the drone. In some embodiments, the estimated magnetometer bias may be used by sensors of the drone to adjust output of the various sensors providing operation information to reduce the bias caused by a hardware component associated with the sensor.

Various embodiments may include sequentially observing the output of a magnetometer at various operation levels or loads (e.g., power utilization, temperature, etc.) of individual processors and hardware components that are nearby (e.g., electronic components and external payloads with electronic components on or within a drone or computing device) to measure or determine an amount of bias of the magnetometer output that is attributable to each component at each power utilization level or load. Using the measured bias generated by each hardware component at each operation level or load, a processor may generate a magnetic interference model that can be used by the processor to estimate the total magnetometer output bias knowing the relevant operation information of the various hardware components in proximity to the magnetometer. The processor may use the magnetic interference model to determine one or more correction factors or components of a bias to apply to the magnetometer output in order to cancel the bias from the magnetometer output. Thus, the processor may measure or determine the operation information (e.g., applied current, processing load, frequency, etc.) of various hardware components, and use the magnetic interference model result to adjust the magnetometer output with reference to one or more of the three axes. Measurements of magnetometer bias caused by individual hardware components at various operation levels may be taken during manufacture, pre-flight, or in flight.

Magnetometers, such as three-axis magnetometers, may be used in combination with Global Navigation Satellite System (GNSS) receivers, accelerometers, and gyroscopes for navigating vehicles. Drones use magnetometers as part of autonomous navigation and attitude control subsystems. Any interaction with magnetic fields generated by nearby hardware components may interfere with the magnetometer reading and the resultant navigation performance. Fluctuating magnetic fields resulting from the flow of electrical current through hardware components operating at high frequencies may be naturally filtered out over long-time scales. Therefore, magnetic fields resulting from hardware components operating at low-frequencies or on direct current (DC) pose the most magnetic interference risk. Hardware components that generate magnetic fields may be DC current carrying wires, main power supplies, electric motors, circuit boards, payload coupling circuitry, and other hardware components.

To minimize magnetic interference, magnetometers are typically mounted on a vehicle or computing device as far from components that generate static or low-frequency magnetic fields as possible. However, this can be difficult for drones because the compact size of most drones prevents the magnetometer from being positioned very far from all hardware components. Further, the problem of magnetometer bias generated by hardware components increases as drones become smaller because hardware components may be placed closer together, such as in a system-on-chip (SOC) configuration. Thus, drones pose a challenging type of application of magnetometers. For this reason, the following descriptions of various embodiments use drones, drone components and drone operations as illustrative examples. However, the claims are not intended to be limited to drones and drone applications unless specifically recited.

In various embodiments, the effect of magnetic interference on the magnetometer may be estimated in real-time based, at least in part on a magnetic interference model generated from the operation information for the various hardware components, such as hardware components of a drone or other computing device. The magnetic bias may be estimated by measuring or obtaining operation information regarding hardware components, for example the electrical current flow, of each hardware component in proximity to the magnetometer. The estimated magnetometer bias may be used to determine compensation factors (values or vector components) used to mitigate or approximately cancel out the effect of the magnetic interference of components on the magnetometer outputs. Such hardware components may include the central processing unit (CPU), graphics processing unit (GPU), digital signal processors (DSPs), video encoders, memory buses, or other circuit board components of a vehicle (e.g., a drone) or computing device. Other sources of magnetic fields may include electrical current carrying wires, power regulators, rotors, etc.

Sources of magnetic interference may also include magnetic fields emitted by permanent magnets within some hardware components in addition to magnetic fields emitted by electrical components within such components. For example, a mechanical camera stabilization gimbal may have electric motors (e.g., stepper motors) that emit magnetic fields when energized and as well as permanent magnets that are sources of magnetic interference at all times. The orientation of magnetic fields emitted by permanent magnets within a mechanical gimbal may vary as the gimbal components rotate. Thus, the amount and orientation of magnetic bias imposed on a magnetometer output by a gimbal including permanent magnets may depend upon the orientation of gimbal. Further, as such a gimbal moves about various axes of rotation in order to stabilize the camera while the drone is in flight, the amount and orientation of magnetic bias imposed on a magnetometer output by the gimbal may change nearly continuously. The location and/or orientation of permanent magnets in mechanical gimbal drive motors may be derived from the angles of the gimbal motors with reference to the drone body. Thus, the instantaneous configuration or orientation of the joints of such a mechanical gimbal may be used as operation information used by a processor to estimate the magnetic interference or bias induced in a magnetometer by permanent magnets in the gimbal, while the applied electrical current may be used by the processor as the operation information to estimate the bias induced in a magnetometer by the electricity flowing through the windings of the drive motors. Some drones may have integrated mechanical gimbals, while some drones may have mechanical gimbal in a payload. In either example, mechanical gimbals may be controlled by a processor on the drone or a separate MCU, which may be configured to communicate operation information in the form of instantaneous motor orientations as well as the current applied to gimbal drive motors for use by a processor (e.g., a processor of the drone or a processor of the magnetometer) in determining the bias induced in a magnetometer output by the gimbal.

Sources of magnetic interference need not be onboard a drone or computing device housing the magnetometer. Hardware components within an external payload of a drone may cause magnetic interference on the magnetometer due to permanent magnets and/or energized electrical components, particularly if the payload is positioned near the magnetometer. The magnetic interference or bias on a magnetometer from a payload may change during operation of the magnetometer when payload components are energized or deenergized. Also, the magnetic interference on the magnetometer due to the payload will disappear if the payload is removed, such as dropped or delivered by the drone during a mission. For this reason, the operation information used by a processor to estimate the bias induced in a magnetometer may include information regarding whether a particular payload is attached to the drone and whether certain hardware components in the payload are activated.

Various embodiments include methods of determining magnetometer bias in real-time without requiring the direct measurement of electrical current flow in hardware components of the drone or computing device, or electrical components in proximity to the drone or computing device. Some operation information, such as the clock rate and percent utilization of a SoC sub-component, may correlate to the energy usage by the sub-component (current flow), and thus may be used as an input parameter for the magnetic interference model. Because electrical current may flow in different paths for different components at different operating states, and location of components inside an SoC may vary, a per-component measurement of magnetic bias may be obtained in combination with an aggregated electrical current flow measurement or another parameter. Similarly, the position of a motor within a drone or computing device may vary, but as long as the electrical wiring is fixed, the electrical current flow may be measured and used in the generation of a magnetic interference model. Such magnetic interference models may account for both constructive and destructive field interference.

During measurement of magnetic interference attributable to individual hardware components, a drone or computing device processor, or a testing computing device may load up each component, including individual components on an SoC, separately and at different currents, percent utilizations, or operating levels. For each hardware component and operation level, the bias appearing on the magnetometer output may be measured and stored in a data structure. After such measurements have been performed for all hardware components at different operating or utilization levels, a data table or mathematical magnetic interference model may be generated from the measurements. The magnetic interference model may be a look up table or a function fitted to the measurement data that may then be used during drone or computing device operations to calculate an estimated magnetometer bias under operating conditions based on measured or otherwise obtained operation information.

Various embodiments may include a drone or computing device configured to autonomously calibrate or recalibrate a magnetometer at any time during operation. Various embodiments may include measuring the impact on a magnetometer reading of hardware components in a drone or computing device to determine a hardware component and operating level model or look up table that can be used to estimate the magnetic interference on the magnetometer. Various embodiments may further include using the model/table to compensate the magnetometer outputs for such magnetic interference. Various embodiments may enable modeling the bias imposed on a magnetometer on a drone or computing device due to the magnetic fields produced by electrical current flowing through hardware components by measuring magnetometer bias effects caused by each hardware component, and storing the data in a magnetic interference model data table. Various embodiments may include calculating one or more navigational compensation factors (e.g., values or vector components) for a drone or computing device magnetometer based on the impact on magnetometer readings of the magnetic fields produced by hardware components. Various embodiments may include modifying the navigation of a drone or computing device to compensate for time-varying sources of magnetic bias by measuring or obtaining operation information on current flow, operating frequency, temperature, clock speed, and/or utilization of device hardware components, and using such operation information to determine one or more compensation factors from a model or look up table determined from calibration measurements.

Figure 1:
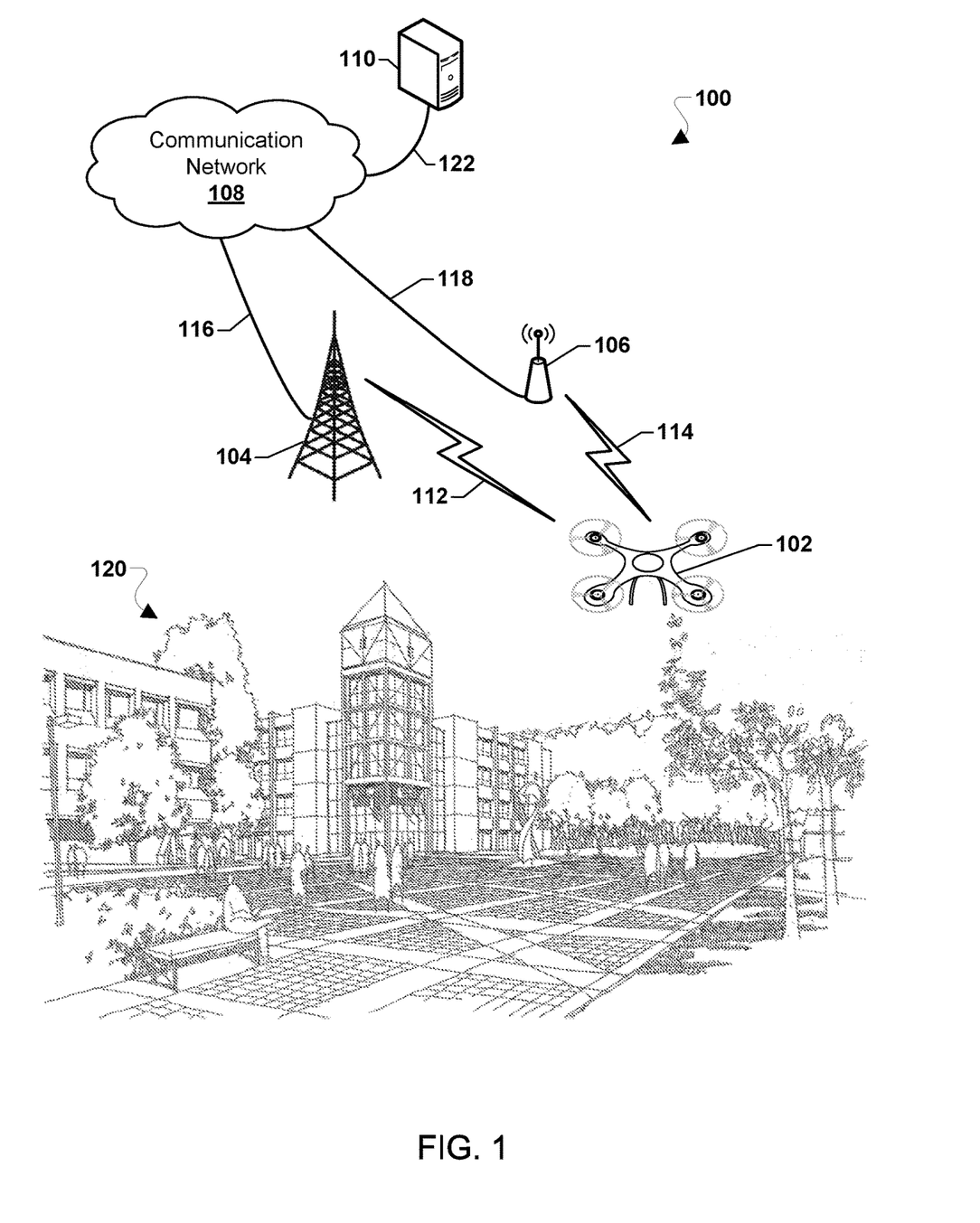
FIG. 1 is a system block diagram of a drone operating within a communication system according to various embodiments.

A drone or other computing device may operate within a variety of communication systems, an example of which may be communication system 100 illustrated in FIG. 1. The communication system 100 may include a drone 102, a base station 104, an access point 106, a communication network 108, and a network element 110.

The base station 104 and the access point 106 may provide wireless communications to access the communication network 108 over a wired and/or wireless communications backhaul 116 and 118, respectively. The base station 104 may include base stations configured to provide wireless communications over a wide area (e.g., macro cells), as well as small cells, which may include a micro cell, a femto cell, a pico cell, and other similar network access points. The access point 106 may include access points configured to provide wireless communications over a relatively smaller area. Other examples of base stations and access points are also possible.

The drone 102 may communicate with the base station 104 over a wireless communication link 112, and with the access point 106 over a wireless communication link 114. The wireless communication links 112 and 114 may include a plurality of carrier signals, frequencies, or frequency bands, each of which may include a plurality of logical channels. The wireless communication links 112 and 114 may utilize one or more radio access technologies (RATs). Examples of RATs that may be used in a wireless communication link include 3GPP Long Term Evolution (LTE), 3G, 4G, 5G, Global System for Mobility (GSM), Code Division Multiple Access (CDMA), Wideband Code Division Multiple Access (WCDMA), Worldwide Interoperability for Microwave Access (WiMAX), Time Division Multiple Access (TDMA), and other mobile telephony communication technologies cellular RATs. Further examples of RATs that may be used in one or more of the various wireless communication links within the communication system 100 include medium range protocols such as Wi-Fi, LTE-U, LTE-Direct, LAA, MuLTEfire, and relatively short range RATs such as ZigBee, Bluetooth, and Bluetooth Low Energy (LE).

The network element 110 may include a network server or another similar network element. The network element 110 may communicate with the communication network 108 over a communication link 122. The drone 102 and the network element 110 may communicate via the communication network 108. The network element 110 may provide the drone 102 with a variety of information, such as navigation information, weather information, information about local air, ground, and/or sea traffic, movement control instructions, and other information, instructions, or commands relevant to operations of the drone 102.

In various embodiments, the drone 102 may move through an environment 120. As the drone 102 moves through the environment 120, the processor of the drone 102 may capture images or video of an aspect of the environment 120.

Figure 2A:
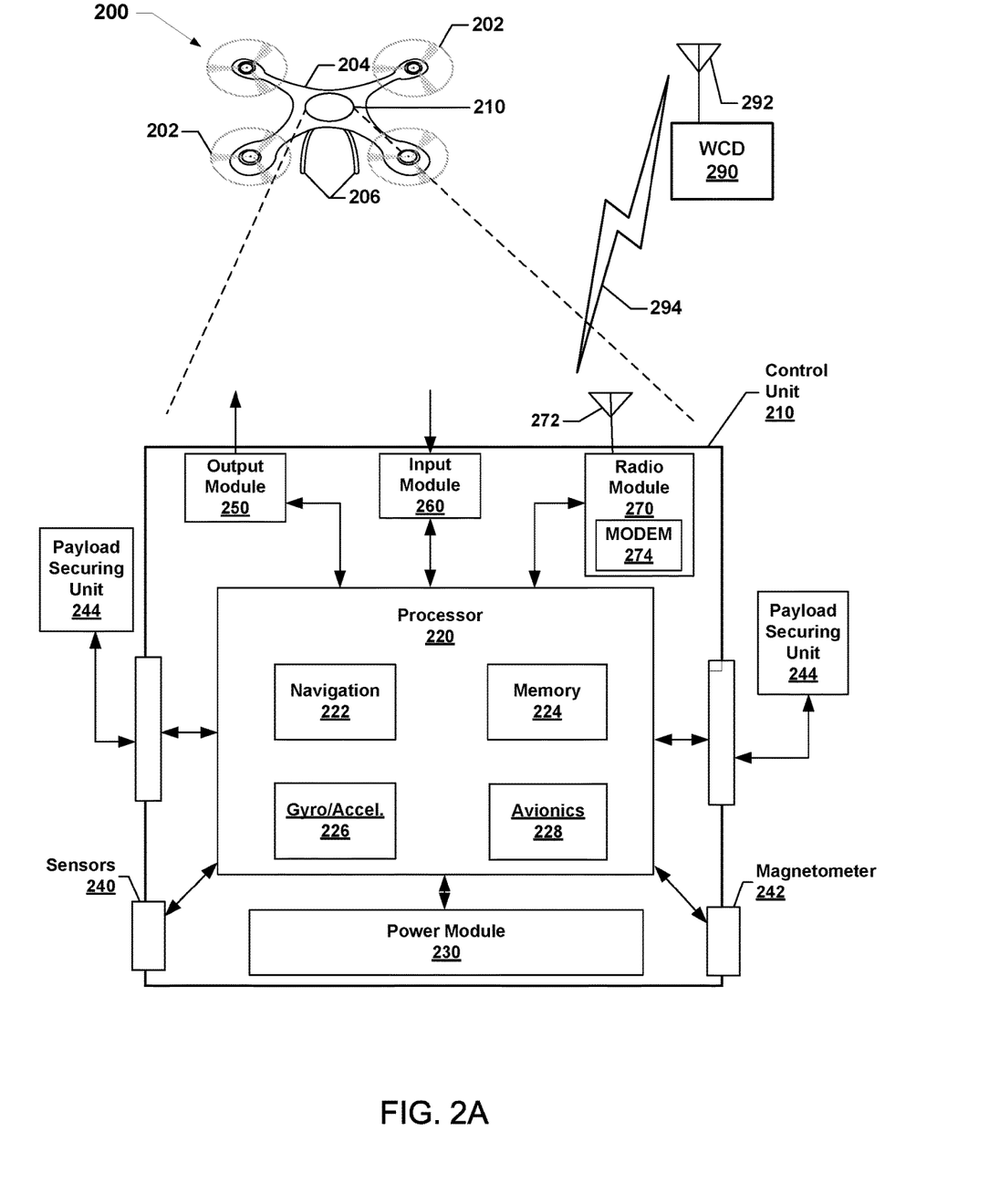
FIGS. 2A-2C are component block diagrams illustrating components of a drone according to various embodiments.
Figure 2B:
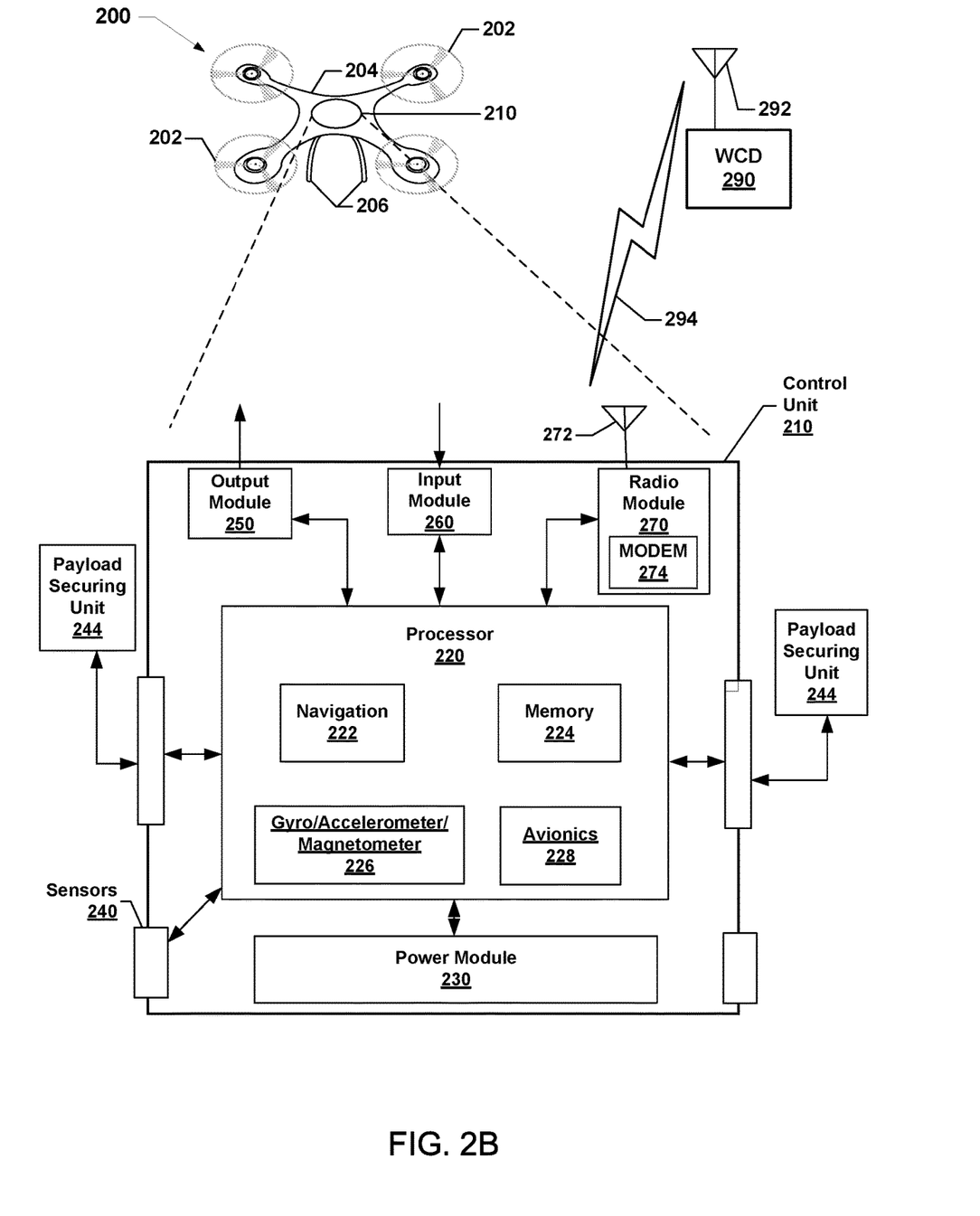
Figure 2C:
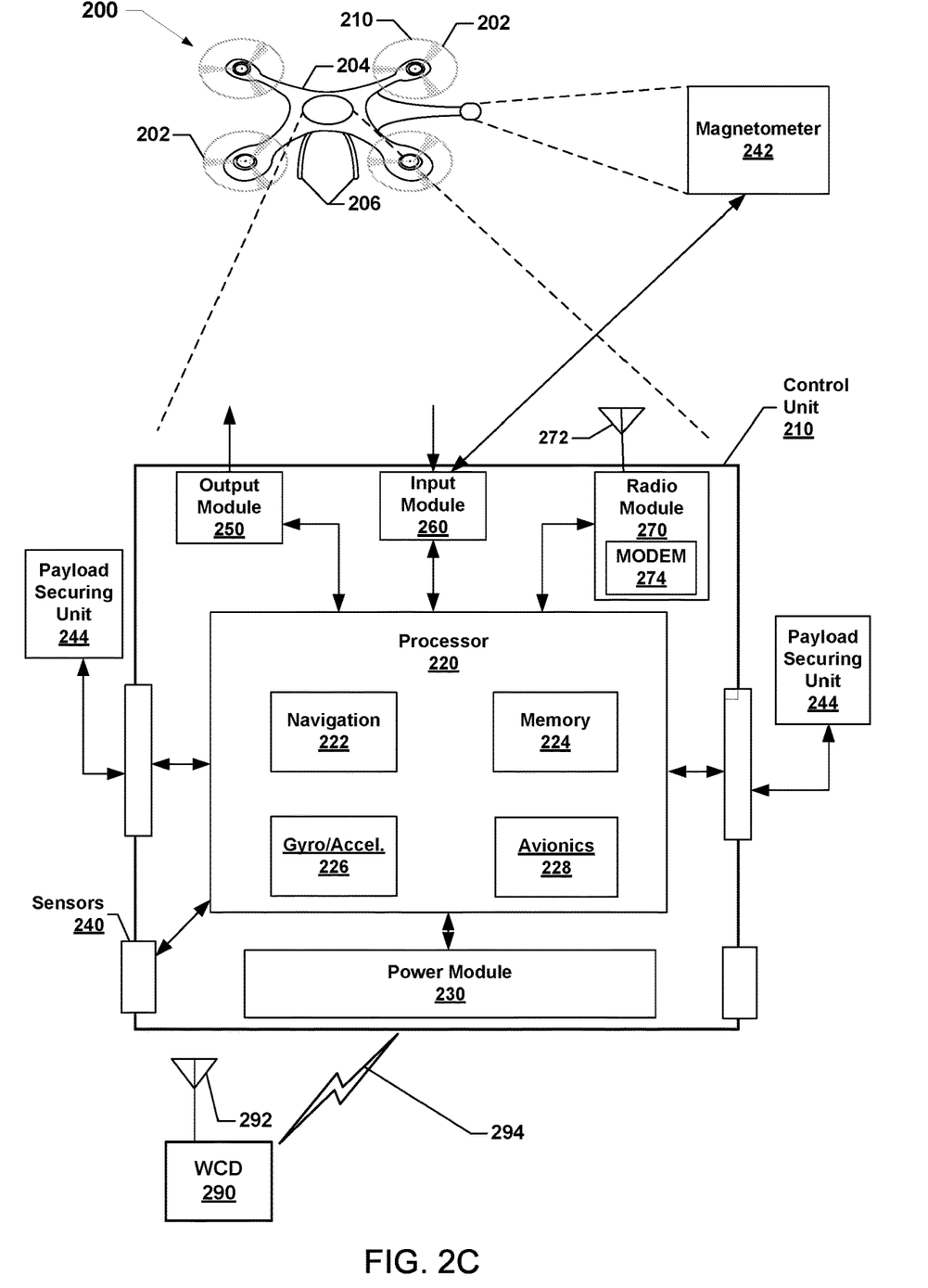

Drones may include winged or rotorcraft varieties. FIGS. 2A-2C illustrate an example drone 200 of a rotary propulsion design that utilizes one or more rotors 202 driven by corresponding motors to provide lift-off (or take-off) as well as other aerial movements (e.g., forward progression, ascension, descending, lateral movements, tilting, rotating, etc.). The drone 200 is illustrated as an example of a drone that may be utilized in various embodiments, but is not intended to imply or require that various embodiments are limited to rotorcraft drones. Various embodiments may be used with winged drones as well. Further, various embodiments may equally be used with land-based autonomous vehicles, water-borne autonomous vehicles, and space-based autonomous vehicles.

With reference to FIGS. 1-2C, the drone 200 may be similar to the drone 102. The drone 200 may include a number of rotors 202, a frame 204, and landing columns 206 or skids. The frame 204 may provide structural support for the motors associated with the rotors 202. The landing columns 206 may support the maximum load weight for the combination of the components of the drone 200 and, in some cases, a payload. For ease of description and illustration, some detailed aspects of the drone 200 are omitted such as wiring, frame structure interconnects, or other features that would be known to one of skill in the art. For example, while the drone 200 is shown and described as having a frame 204 having a number of support members or frame structures, the drone 200 may be constructed using a molded frame in which support is obtained through the molded structure. While the illustrated drone 200 has four rotors 202, this is merely exemplary and various embodiments may include more or fewer than four rotors 202.

The drone 200 may further include a control unit 210 that may house various circuits and devices used to power and control the operation of the drone 200. The control unit 210 may include a processor 220, a power module 230, sensors 240, a magnetometer 242, payload securing unit 244, an output module 250, an input module 260, and a radio module 270. In some embodiments, such as those shown in FIG. 2A, the magnetometer 242 may be a separate on-board component.

The processor 220 may be configured with processor-executable instructions to control travel and other operations of the drone 200, including operations of various embodiments. The processor 220 may include or be coupled to a navigation unit 222, a memory 224, a gyro/accelerometer unit 226, an avionics module 228, and the magnetometer 242. The processor 220 and/or the navigation unit 222 may be configured to communicate with a server (e.g., the network element 110) through a wireless connection (e.g., a cellular data network) to receive data useful in navigation, provide real-time position reports, and assess data.

The avionics module 228 may be coupled to the processor 220 and/or the navigation unit 222, and may be configured to provide travel control-related information such as altitude, attitude, airspeed, heading, and similar information that the navigation unit 222 may use for navigation purposes, such as dead reckoning between GNSS position updates. The gyro/accelerometer unit 226 may include an accelerometer, a gyroscope, an inertial sensor, or other similar sensors. The avionics module 228 may include or receive data from the gyro/accelerometer unit 226 that provides data regarding the orientation and accelerations of the drone 200, which in combination with an output from the magnetometer 242 that may be used in navigation and positioning calculations, as well as providing data used in various embodiments for processing images. In some embodiments, such as those illustrated in FIG. 2B, the magnetometer may be a sub-component of another component, such as the gyro/accelerometer unit 226.

The processor 220 may further receive additional information from the sensors 240, such as an image sensor or optical sensor (e.g., capable of sensing visible light, infrared, ultraviolet, and/or other wavelengths of light). The sensors 240 may also include a radio frequency (RF) sensor, a barometer, a sonar emitter/detector, a radar emitter/detector, a microphone or another acoustic sensor, or another sensor that may provide information usable by the processor 220 for movement operations as well as navigation and positioning calculations. The sensors 240 may include contact or pressure sensors that may provide a signal that indicates when the drone 200 has made contact with a surface. The payload securing units 244 may include an actuator motor that drives a gripping and release mechanism and related controls that are responsive to the control unit 210 to grip and release a payload in response to commands from the control unit 210. A payload securing unit 244 may include a solenoid that generates a magnetic field when energized to couple a payload to the drone 200. In such embodiments, the flow of electrical current through the payload securing unit 244 may produce a magnetic field that interferes with the output of the magnetometer of the drone and/or the payload. Thus, the payload securing unit 244 may be a source of magnetic interference that may be tested during generation of the magnetic interference model to make sure that the magnetic interference model includes the interference caused by the payload securing unit 244. This may enable the processor of the drone or payload to compensate for the magnetic interference caused by the payload securing unit 244 on the drone 200 when a payload is secured.

In some embodiments, such as those illustrated in FIG. 2C, the magnetometer may be positioned within an arm, a wing, or other portion of the drone 200 that is remote/distal from other hardware components. Placing the magnetometer 244 as far away as possible from the sources of magnetic interference may enable improved accuracy of magnetic interference mitigation by limiting the number of hardware components that are close enough to inference with the magnetometer output. The power module 230 may include one or more batteries that may provide power to various components, including the processor 220, the sensors 240, the payload-securing units 244, the output module 250, the input module 260, and the radio module 270. In addition, the power module 230 may include energy storage components, such as rechargeable batteries. The processor 220 may be configured with processor-executable instructions to control the charging of the power module 230 (i.e., the storage of harvested energy), such as by executing a charging control algorithm using a charge control circuit. Alternatively or additionally, the power module 230 may be configured to manage its own charging. The processor 220 may be coupled to the output module 250, which may output control signals for managing the motors that drive the rotors 202 and other components.

The drone 200 may be controlled through control of the individual motors of the rotors 202 as the drone 200 progresses toward a destination. The processor 220 may receive data from the navigation unit 222 and use such data in order to determine the present position and orientation of the drone 200, as well as the appropriate course towards the destination or intermediate sites. In various embodiments, the navigation unit 222 may include a GNSS receiver system (e.g., one or more global positioning system (GPS) receivers) enabling the drone 200 to navigate using GNSS signals. Alternatively or in addition, the navigation unit 222 may be equipped with radio navigation receivers for receiving navigation beacons or other signals from radio nodes, such as navigation beacons (e.g., very high frequency (VHF) omni-directional range (VOR) beacons), Wi-Fi access points, cellular network sites, radio station, remote computing devices, other drones, etc.

The radio module 270 may be configured to receive navigation signals, such as signals from aviation navigation facilities, etc., and provide such signals to the processor 220 and/or the navigation unit 222 to assist in drone navigation. In various embodiments, the navigation unit 222 may use signals received from recognizable RF emitters (e.g., AM/FM radio stations, Wi-Fi access points, and cellular network base stations) on the ground.

The radio module 270 may include a modem 274 and a transmit/receive antenna 272. The radio module 270 may be configured to conduct wireless communications with a variety of wireless communication devices (e.g., a wireless communication device (WCD) 290), examples of which include a wireless telephony base station or cell tower (e.g., the base station 104), a network access point (e.g., the access point 106), a beacon, a smartphone, a tablet, or another computing device with which the drone 200 may communicate (such as the network element 110). The processor 220 may establish a bi-directional wireless communication link 294 via the modem 274 and the antenna 272 of the radio module 270 and the wireless communication device 290 via a transmit/receive antenna 292. In some embodiments, the radio module 270 may be configured to support multiple connections with different wireless communication devices using different radio access technologies.

In various embodiments, the wireless communication device 290 may be connected to a server through intermediate access points. In an example, the wireless communication device 290 may be a server of a drone operator, a third-party service (e.g., package delivery, billing, etc.), or a site communication access point. The drone 200 may communicate with a server through one or more intermediate communication links, such as a wireless telephony network that is coupled to a wide area network (e.g., the Internet) or other communication devices. In some embodiments, the drone 200 may include and employ other forms of radio communication, such as mesh connections with other drones or connections to other information sources (e.g., balloons or other stations for collecting and/or distributing weather or other data harvesting information).

In various embodiments, the control unit 210 may be equipped with an input module 260, which may be used for a variety of applications. For example, the input module 260 may receive images or data from an onboard camera or sensor, or may receive electronic signals from other components (e.g., a payload).

While various components of the control unit 210 are illustrated as separate components, some or all of the components (e.g., the processor 220, the output module 250, the radio module 270, and other units) may be integrated together in a single device or module, such as a system-on-chip module.

Figure 3:
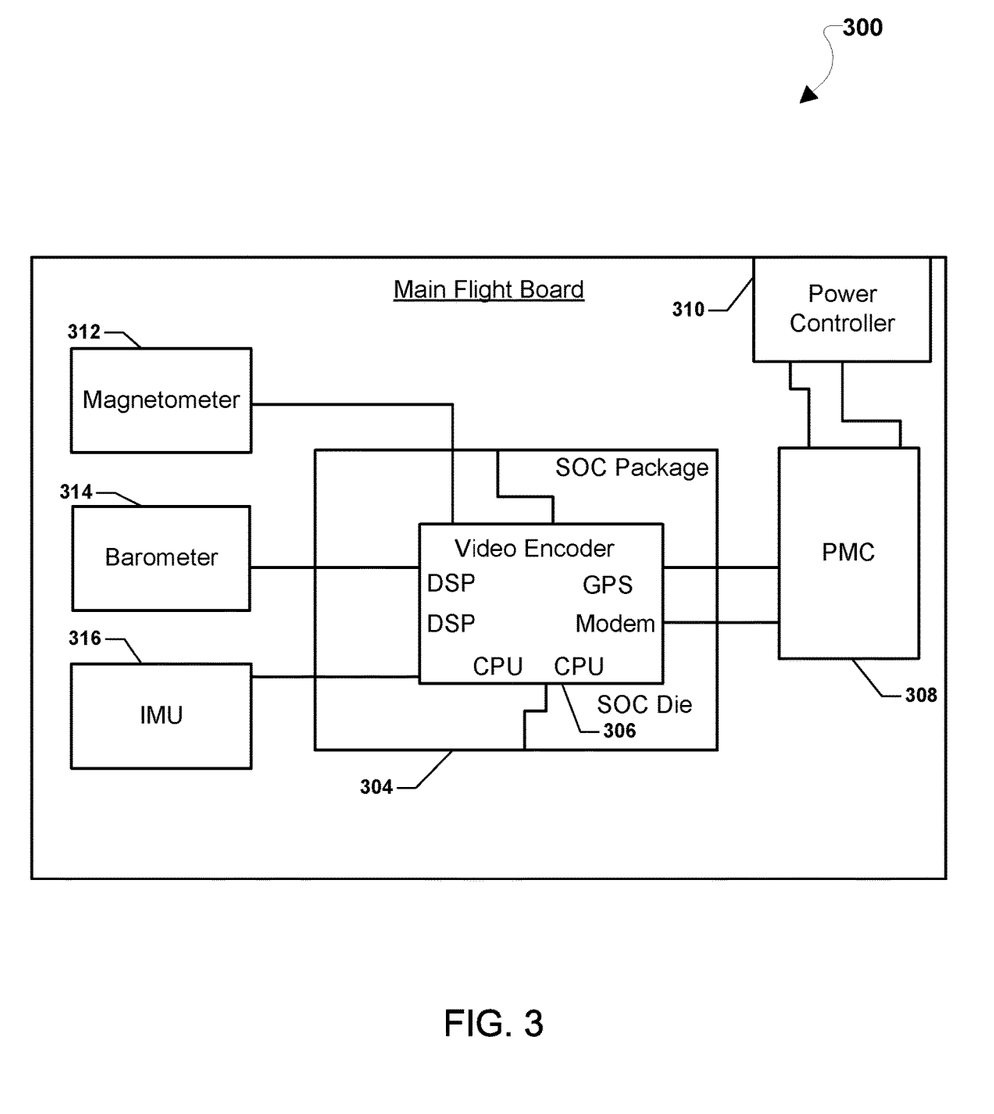
FIG. 3 is a component block diagram illustrating components of a printed circuit board (PCB) of a drone according to various embodiments.

An exemplary printed circuit board (PCB) of a drone (e.g., drone 200) is illustrated in FIG. 3. With reference to FIGS. 1-3, a drone (e.g., drone 200) may have a main flight board 300 such as a printed circuit board (PCB) or other logic board structure including some of the components of FIG. 2 and their associated electrical connections. Such components may include a processor 220, navigation unit 222, avionics unit 228, gyro/accelerometer unit 226, and components of a power module 230. The main flight board 300 may have a SoC package 304 with an SoC die 306. The SoC die 306 may include various processing components such as one or more CPUs (e.g., processor 220), one or more DSPs, one or more modems, a GPS receiver, and a video encoder. The various components of the SoC die 306 may be electrically connected to at least a magnetometer 312, a barometer 314, and an inertial measurement unit (IMU) 316, and a power management chip (PMC) 310. The PMC 310 may be electrically connected to a power controller 308.

Because magnetometers use the magnetic field of Earth to estimate a heading for the drone, magnetic fields generated by magnetic sources or electrical currents, such as those caused by electronic and electrical hardware components of the drones, may cause computational errors in heading estimations determined by the drone. In drones and computing devices, hardware components that are sources of bias on a magnetometer 242, 312 may be located inside and outside the SoC package 304, sub-components of SoC die 306, and a PMC 310, etc. Magnetic interference, such as low-frequency time-varying magnetic interference may also result from sources that are not located near the SoC package 304 but are within proximity to the magnetometer 242, 312. Such sources may include the various motors of the drone (e.g., drone 200) and any external payloads that have magnetic and/or electrical components in proximity to the magnetometer 242, 312. For example, electronic payloads may include antennas, cameras, motors, and additional sensors. Near flying drones, may also emit magnetic fields that may interfere with the magnetometer output of drone 200 if flying close enough.

In some embodiments, the drone 200 may generate a magnetic interference model by observing changes or bias in the output of a magnetometer 242, 312 as individual hardware components are energized or powered at varying operation (e.g., utilization) levels as part of an initial calibration or during flight. During the measuring process, electrical hardware components within a payload may also be energized or powered at varying operation levels so that magnetic interference by payload hardware components may be determined. In order for the processor 220 to obtain operation information (e.g., utilization, frequency, electrical current flow, etc.) from or for the hardware components of an external payload, the processor 220 may be configured to recognize the type and/or model of the external payload or of the payload's hardware components. For example, the processor 220 may identify the logic board of an external payload in order to obtain accurate operation information. The drone 200 may receive external payload hardware component type and model information as part of a software update, or may receive this information from a connection to the external payload.

In some embodiments, the magnetometer 242 may be an off-board component separated from other equipment on the device. For example, the magnetometer 242 may be in communication with a navigation unit 222, a gyro/accelerometer 226, and/or avionics 228, but may be physically located in a wing, tail, or blade of the drone, such as illustrated in FIG. 2C. In some embodiments, the magnetometer 242 may be a component of a separate device such as a smartphone or wearable device, that may be removably coupled to the drone. For ease of description, the magnetometer 242, 312 is described with reference to an on-board model, however such descriptions are not intended to limit the scope of the claims to on-board magnetometers of a drone. In some embodiments, the magnetometer 242 may be integrated with a processor (not shown but similar to the processor 220) that is configured to perform operations of various embodiments to form a magnetometer system.

Figure 4:
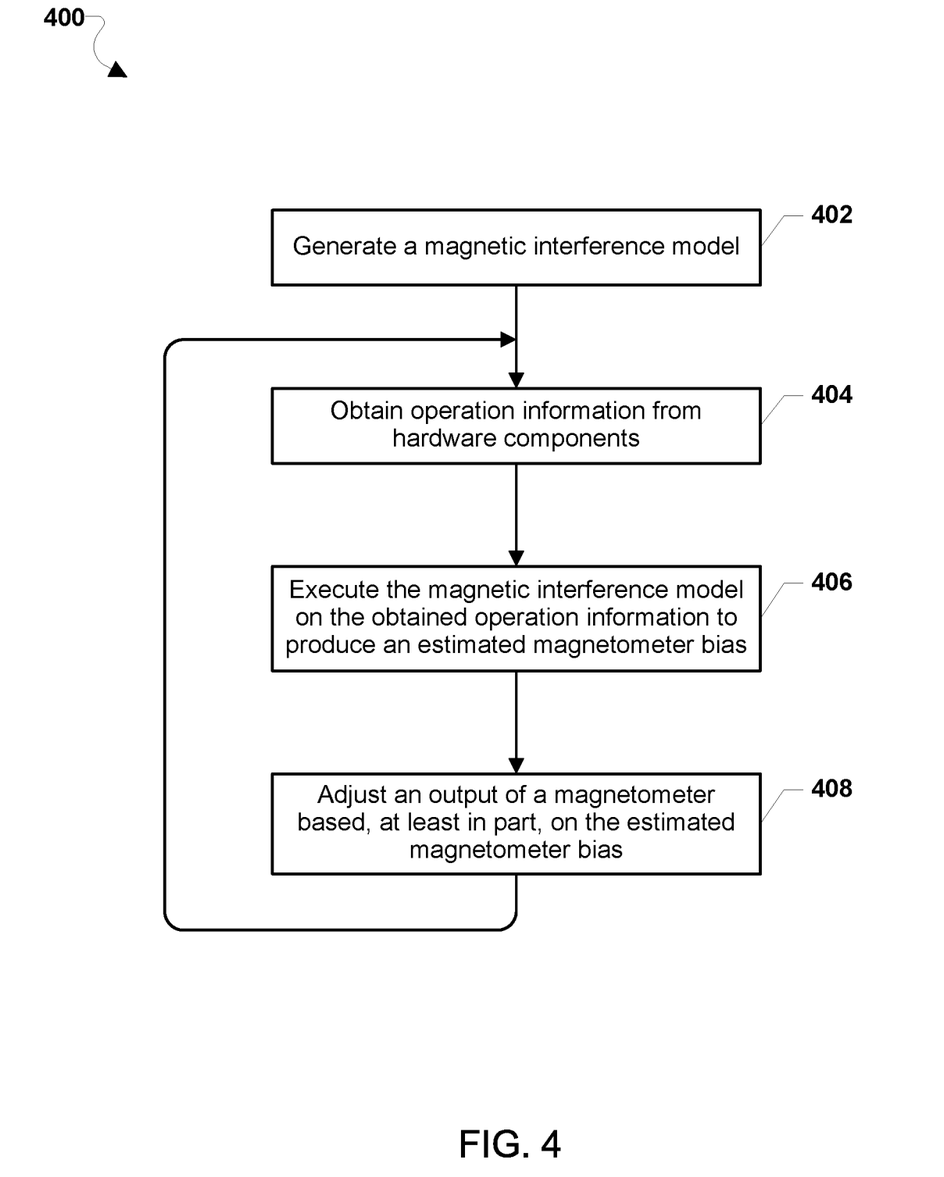
FIG. 4 is a process flow diagram illustrating a method for mitigating interference on a magnetometer according to various embodiments.

FIG. 4 illustrates a method 400 of compensating for magnetic field biases imposed on a magnetometer (e.g., 242, 312) on a drone (e.g., 200) or computing device according to various embodiments. With reference to FIGS. 1-4, the method 400 may be implemented by a processor (e.g., the processor 220 and/or the like) of the drone or computing device, or a processor within the magnetometer. The processor may calibrate the effects of all sources of electric current flows that generate magnetic fields that may bias magnetometer enabling the processor to calculate compensation or corrections to remove bias from magnetometer outputs. In particular, the processor may compensate for low-frequency, time-varying magnetic interference.

In block 402, the processor may generate a magnetic interference model. The magnetic interference model may be a set of mathematical equations or a data structure storing measured magnetometer bias measurements correlated to measured or otherwise obtained operation information, clock settings, etc. for the hardware components in proximity to the magnetometer. For example, the magnetic interference model may be a look-up table storing the measured or obtained operations information and correlated magnetic interference or bias on a magnetometer. The data in the look-up table may be normalized or otherwise filtered. In a further example, the magnetic interference model may be one or more functions fit to the data contained within the data structure, thereby characterizing or mapping the measured or otherwise obtained operation information to resulting magnetic bias. The magnetic interference model may be generated in a factory prior to drone operation, during an initial calibration of the drone, or during operations. The model may be generated using measurements obtained from individual hardware components as well as aggregate measurements of hardware components. Example methods of generating a magnetic interference model are discussed in greater detail with reference to FIGS. 5 and 6.

In block 404, the processor may obtain operation information from hardware components in proximity to the magnetometer. During operation of the drone, the processor may communicate with onboard sensors or the feedback of individual hardware components to determine current operations information for each hardware component, as well as the hardware components in aggregate. Operation information may include utilization rate, frequency, clock speed, electrical current flow, temperature etc. The processor may request this information at regular intervals, sporadically, upon detecting that a navigation heading is inaccurate, etc. In some embodiments, obtaining the operations information may include obtaining operations information for an external payload in communication with the drone 200, such as an antenna, a camera, or other sensors.

In block 406, the processor 220 may execute the magnetic interference model on the obtained operation information to produce an estimated magnetometer bias. The obtained operations information may be passed as inputs to a magnetic interference model. In some embodiments, the magnetic interference model may be a set of mathematical functions or a data structure storing exemplary operations information obtained during measurements. The input may be used as numerical values for parameters of one or more mathematical functions, with an output of an estimated magnetic bias. In other embodiments, the input may be used to search a look-up table for a corresponding estimated magnetic bias, which may be fetched and returned as output for the magnetic interference model. A result of executing the magnetic interference model on the operations information may be an estimated magnetometer bias. Because the magnetic fields caused by the electrical current of various hardware components may be three-dimensional vector fields the magnetic interference model may be a mathematical model that accepts operations information as input and produces magnetometer bias including a compensation factor for each of the navigational axes. Therefore, in some embodiments the estimated magnetometer bias may be a vector triple.

In block 408, the processor 220 may adjust an output of the magnetometer 312 of the drone 200 based, at least in part, on the estimated magnetometer bias. The processor may add, subtract, multiple, or divide the output of the magnetometer from the estimated magnetometer bias. Each coordinate component of the estimated magnetometer bias may be applied to a corresponding coordinate of the magnetometer output using various mathematical operations to compensate for the impact of low-frequency time-varying interference on the magnetometer.

In some embodiments, the estimated magnetic interference may be used to adjust the output of various sensors of the drone. For example, the estimated magnetic interference may be an offset provided to one or more sensors by the processor. The sensor may apply the offset internally, thus providing compensated data, without requiring the processor to directly adjust output to compensate for bias. In such embodiments, the processor may perform the operations of interference model building and estimating magnetic interference, but may shift the task of sensor output adjustment to the sensors.

The method 400 may be performed periodically or continuously as the processor may obtain new or updated operation information from hardware components in block 404 and repeat the operations of blocks 406 and 408 to update the adjustment to the magnetometer output as the operating states and utilization levels of hardware components change over time.

Figure 5:
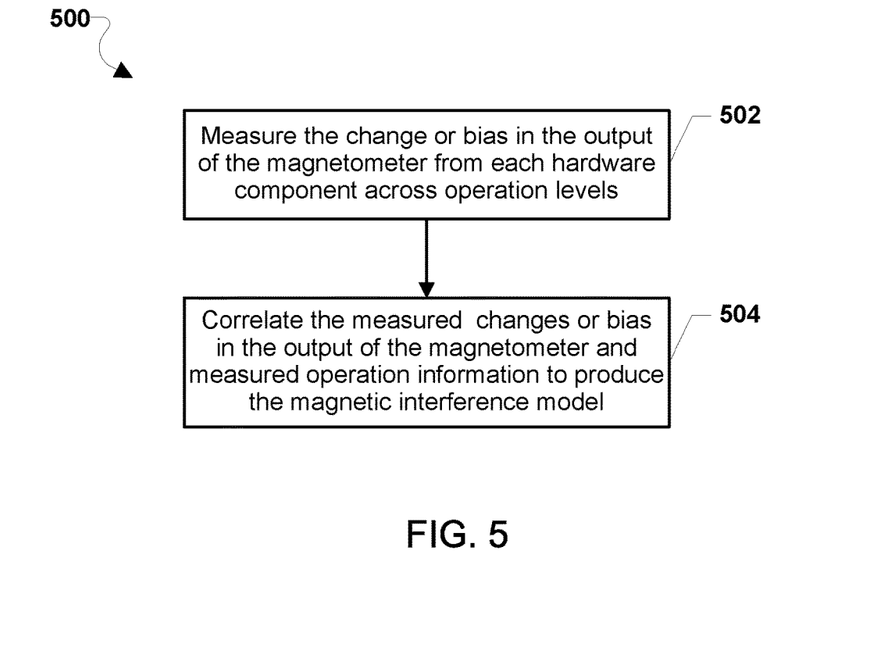
FIG. 5 is a process flow diagram illustrating a method for generating a magnetic interference model for use in mitigating interference on a magnetometer according to various embodiments.

FIG. 5 illustrates a method 500 of generating a magnetic interference model for use in mitigating magnetic interference on magnetometer (e.g., 242, 312) of a drone (e.g., 200) or other computing device according to various embodiments. With reference to FIGS. 1-5, the method 500 may be implemented by a processor (e.g., the processor 220 and/or the like) of the drone (e.g., 200), or a processor within the magnetometer. The processor may measure different characteristics of hardware components of the drone and may use the obtained measurements to generate a magnetic interference model.

Various embodiments may include measuring various operating characteristics, such as electrical current flow of each of the hardware components and the combined electrical current flow of the hardware components across hardware component operation levels in block 502. The measured information may be operation information related or correlated to the generation of magnetic fields. In some embodiments, the measurements may be obtained during factory testing of the hardware components. Because measurements may be approximately the same across different SoC packages (e.g., SoC package 304), factory based measurements may enable the pre-loading of measurements or a magnetic interference model into a memory of the drone. During the measurements, the processor may load up each hardware component separately at different operation levels, using similar settings as those used in actual drone operations. The processor may measure how the hardware component operating characteristics impact electrical current flow and may add this information to a look up table. In some embodiments, this process may be executed by the processor during initial calibration of the drone in preparation for operations, or during normal operations.

During the measurements, each hardware component may be energized and/or loaded up separately and also in combination. The load on or power applied to a hardware component may be gradually increased (e.g., increase in utilization level) and any changes to the magnetometer output may be observed. For each hardware component operation level, such as a utilization range (e.g., 5%-1 10%) the resulting change or bias in the magnetometer output may be recorded as an entry in a data structure and in association with the hardware component and the utilization level. This process may be repeated for all utilization levels (e.g., 0%-100) for each hardware component, and similarly for the hardware components in combination. The resulting data structure may include data associating measured or otherwise obtained operation information of hardware components to respective changes or bias in the magnetometer output. The gathered measurement data may be used to generate a magnetic interference model that includes a mapping of measured or otherwise obtained operation information of hardware components to observed changes or bias in the magnetometer output. Such a magnetic interference model may enable a drone in operation to indirectly estimate the bias imposed on the magnetometer output of its various hardware components based solely on the hardware component operation characteristics such as changes in utilization level, frequency, temperature, clock speed, and electrical current flow.

During measurement of the changes or bias in the magnetometer output at different operation levels of the hardware components, the magnetic field vectors associated with the hardware components may be calculated. For example, a three-dimensional magnetic field vector produced by each hardware component as operating characteristics change may be calculated. If the magnetometer is placed with a fixed distance from a given hardware component, then the resultant magnetic field interference on the magnetometer may be modeled as a bias vector with some angular displacement. The vector offset (e.g., compensation factors) may be the three-dimensional impact (e.g., a bias vector) of the aggregate magnetic fields on the magnetometer output. The vector offset may change as operating characteristics of hardware components change due to the changes in the magnetic field produced by each individual hardware component. The calculated magnetic bias vector may be included in the fitting of the measured data to an equation in order to produce one or more equations of a magnetic interference model that accept utilization information as an input, and produce an estimated vector offset or magnetometer bias without having to directly obtain the electrical current flow information and recalculation of magnetic field interference of individual components. Similarly, the vector offset components may be stored in a look-up table in association with the respective operation information, such that a table query using the operation information as input will result in the return of the correlated bias vector component. Thus, the bias vector may be the estimated magnetic bias.

In block 504, the processor may correlate the measured changes or bias in the magnetometer output and measured or otherwise obtained operation information to produce the magnetic interference model. While a look up table may be generated during the obtaining of measurements, this data structure may be intractably large and therefore may not be actually stored on the drone. As such, in some embodiments, one or more mathematical functions may be fitted to the obtained measurement data to produce a magnetic interference model. In such embodiments, the magnetic interference model may be a linear model if the interference caused by each hardware component individually when summed is approximately the same as the measured total interference of all hardware components (e.g., an observed aggregate electrical current flow).

Figure 6:
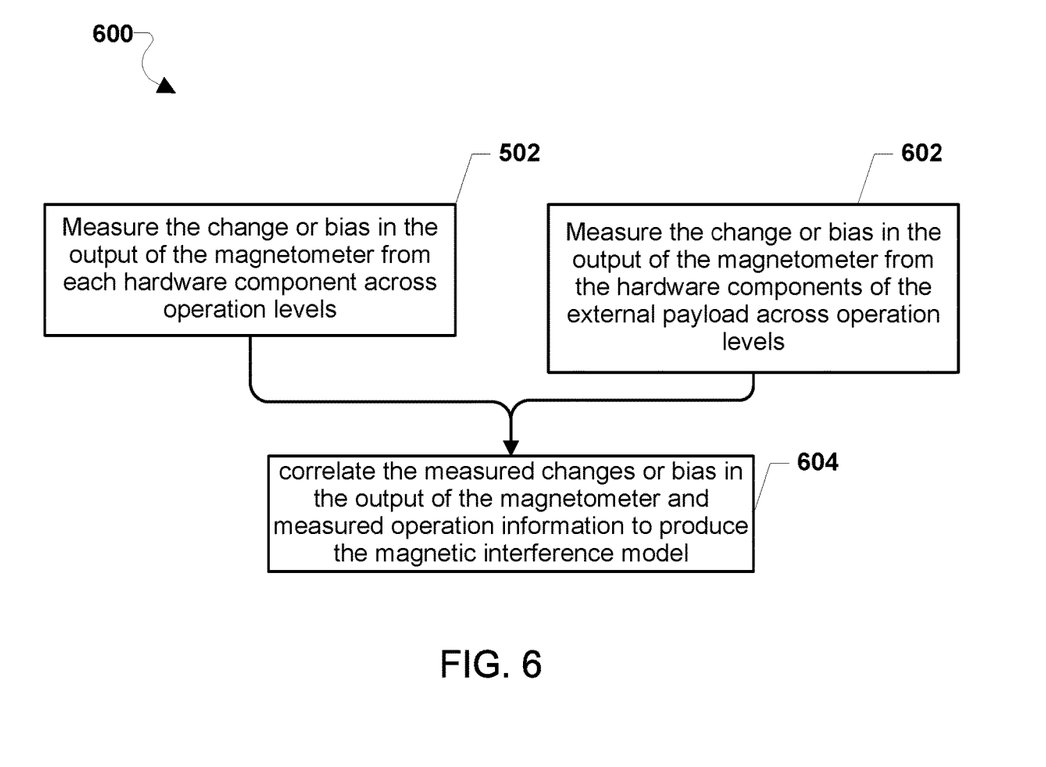
FIG. 6 is a process flow diagram illustrating a method for generating a magnetic interference model for use in mitigating interference on a magnetometer according to various embodiments.

FIG. 6 illustrates a method 600 of generating a magnetic interference model for use in mitigating magnetic interference on a magnetometer (e.g., 242, 314) of a drone (e.g., 200) or other computing device according to various embodiments. With reference to FIGS. 1-6, the method 600 may be implemented by a processor (e.g., the processor 220 and/or the like) of the drone or computing device, or a processor within the magnetometer. The processor may generate a magnetic interference model that includes interference from proximal hardware components, such as both onboard hardware components as well as external payload hardware components.

In block 502, the processor may measure the changes or bias in the magnetometer output resulting from operating or energizing each of the hardware components across hardware component operation levels. This operation may proceed in the same manner as that described with reference to block 502 of the method 500.

In block 602, the processor may measure the changes or bias in the magnetometer output resulting from operating or energizing each external payload hardware component and the combined operation information of the external payload hardware components at various operation levels. In various embodiments, the processor may have prior knowledge of the types and models of external payloads that may be connected and may receive a data structure containing external payload measurements made in a factory or prior to payload installation. In some embodiments, the processor may perform the measurements during an initial calibration of the drone or during normal operations. The measurements of the changes or bias in the magnetometer output resulting from operating or energizing the external payload may be obtained in real-time and incorporated into the existing or obtained onboard hardware component information to produce the magnetic interference model. In some embodiments, the measurements of the changes or bias in the magnetometer output resulting from operating or energizing the external payload may be obtained in the same manner as the measurements of the changes or bias in the magnetometer output resulting from operating or energizing onboard hardware components (e.g., in a factory, at initial calibration). In some embodiments, the measurements of the changes or bias in the magnetometer output resulting from operating or energizing external payload hardware component may be obtained in a manner different from that of the onboard hardware components. For example, the magnetic fields produced by onboard hardware components at various utilization levels may be measured in a factory prior to delivery of the drone, while the measurements of the changes or bias in the magnetometer output resulting from operating or energizing external payload hardware components may be obtained during initial calibration, pre-flight, etc.

In block 604, the processor may correlate the measured changes or bias in the magnetometer output and measured or otherwise obtained operation information of both the hardware components of the drone and the external payload hardware components to produce the magnetic interference model. This operation may be executed in a manner similar to that described with reference to block 504 of the method 500.

Some embodiments may be implemented as a magnetometer system including at least one magnetometer and a processor (e.g., similar to the processor 220) that is configured to perform operations of any of the methods 400-600. Some embodiments may be a drone that includes at least one magnetometer and a processor (e.g., 220) that is configured to perform operations of any of the methods 400-600.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 400, 500, and 600 may be substituted for or combined with one or more operations of the methods 400, 500, and 600, and vice versa.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the claims.

The hardware used to implement various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

What is claimed is:

1. A method of mitigating bias of a magnetometer in a computing device having a plurality of external payload hardware components, comprising:
    obtaining, by a processor of the computing device, operation information from hardware components of the computing device in proximity to the magnetometer;
    generating a magnetic interference model by:
        measuring changes or bias in an output of the magnetometer resulting from operating or energizing each of the plurality of external payload hardware components across operation levels of the external payload hardware components; and
        correlating each of the measured changes or bias in the output of the magnetometer and the operation levels of the external payload hardware components to produce the magnetic interference model;
    executing, by the processor, the generated magnetic interference model using the obtained operation information to produce an estimated magnetometer bias; and
    adjusting an output of the magnetometer based, at least in part, on the estimated magnetometer bias.

2. The method of claim 1, wherein obtaining operation information from hardware components in proximity to the magnetometer comprises obtaining operation information from hardware components included on the same computing device as the magnetometer.

3. The method of claim 1, wherein the computing device comprises a drone.

4. The method of claim 1, wherein the operation information is at least one of a utilization measurement, an electrical input, an operating frequency, an operating mode, and a temperature for each of the hardware components.

5. The method of claim 1, wherein generating the magnetic interference model further comprising:
    measuring changes or bias in the output of the magnetometer resulting from operating or energizing the hardware components in addition to the external payload hardware components across operation levels of the hardware components; and
    correlating the measured changes or bias in the output of the magnetometer and obtained operation information, from the hardware components in addition to the external payload hardware components, to produce the magnetic interference model.

6. The method of claim 1, wherein the magnetic interference model is generated prior to initial operation of the computing device including the hardware components and the magnetometer.

7. The method of claim 1, wherein the magnetic interference model is generated during initial operation of the computing device including the hardware components and the magnetometer.

8. The method of claim 1, wherein obtaining, by the processor, operation information from hardware components further comprises obtaining, by the processor, operation information from the external payload hardware components.

9. A magnetometer system in a computing device having a plurality of external payload hardware components, comprising:
    a magnetometer; and a processor of the computing device coupled to the magnetometer and configured with processor-executable instructions to:
  obtain operation information from hardware components of the computing device in proximity to the magnetometer;
  generate a magnetic interference model by:
    measuring changes or bias in an output of the magnetometer resulting from operating or energizing each of the plurality of external payload hardware components across operation levels of the external payload hardware components; and
    correlating each of the measured changes or bias in the output of the magnetometer and the operation levels of the external payload hardware components to produce the magnetic interference model;
  execute the generated magnetic interference model using the obtained operation information to produce an estimated magnetometer bias; and
  adjust an output of the magnetometer based, at least in part, on the estimated magnetometer bias.

10. The magnetometer system of claim 9, wherein the operation information is at least one of a utilization measurement, an electrical input, an operating frequency, an operating mode, and a temperature for each of the hardware components.

11. The magnetometer system of claim 9, wherein the processor is further configured with processor-executable instructions to generate the magnetic interference model by:
  measuring changes or bias in the output of the magnetometer resulting from operating or energizing the hardware components in addition to the external payload hardware components across operation levels of the hardware components; and
  correlating the measured changes or bias in the output of the magnetometer and obtained operation information, from the hardware components in addition to the external payload hardware components, to produce the magnetic interference model.

12. The magnetometer system of claim 9, wherein the processor is further configured with processor-executable instructions to generate the magnetic interference model prior to initial operation of the computing device including the hardware components and the magnetometer system.

13. The magnetometer system of claim 9, wherein the processor is further configured with processor-executable instructions to generate the magnetic interference model during initial operation of the computing device including the hardware components and the magnetometer system.

14. The magnetometer system of claim 9, wherein the processor is further configured with processor-executable instructions to obtain operation information from external payload hardware components.

15. The magnetometer system of claim 9, wherein the magnetometer is a component of a drone and the processor is a processor on the drone.

16. A drone having a plurality of external payload hardware components, comprising:
  a magnetometer; and
  a processor coupled to the magnetometer and configured with processor-executable instructions to:
    obtain operation information from hardware components of the drone in proximity to the magnetometer;
    generate a magnetic interference model by:
      measuring changes or bias in an output of the magnetometer resulting from operating or energizing each of the plurality of external payload hardware components across operation levels of the external payload hardware components; and
      correlating each of the measured changes or bias in the output of the magnetometer and the operation levels of the external payload hardware components to produce the magnetic interference model;
    execute the generated magnetic interference model using the obtained operation information to produce an estimated magnetometer bias; and
    adjust an output of the magnetometer based, at least in part, on the estimated magnetometer bias.

17. The drone of claim 16, wherein the operation information is at least one of a utilization measurement, an electrical input, an operating frequency, an operating mode, and a temperature for each of the hardware components.

18. The drone of claim 16, wherein the processor is further configured with processor-executable instructions to generate the magnetic interference model by:
  measuring changes or bias in the output of the magnetometer resulting from operating or energizing the hardware components of the drone in proximity to the magnetometer in addition to the external payload hardware components across a range of operation levels of the hardware components; and
  correlating the measured changes or bias in the output of the magnetometer and obtained operation information, from the hardware components in addition to the external payload hardware components, to produce the magnetic interference model.

19. The drone of claim 16, wherein the processor is further configured with processor-executable instructions to generate the magnetic interference model prior to initial operation of the drone.

20. The drone of claim 16, wherein the processor is further configured with processor-executable instructions to generate the magnetic interference model during initial operation of the drone.

21. The drone of claim 16, wherein the processor is further configured with processor-executable instructions to obtain operation information from hardware components of an external payload of the drone.

22. A drone having a magnetometer and a plurality of external payload hardware components, comprising:
  means for obtaining operation information from hardware components of the drone in proximity to the magnetometer wherein the operation information is at least one of a utilization measurement, an electrical input, an operating frequency, an operating mode, and a temperature for each of the hardware components;
  means for generating a magnetic interference model by:
    means for measuring changes or bias in the output of the magnetometer resulting from operating or energizing each of the plurality of external payload hardware components across operation levels of the external payload hardware components; and
    means for correlating each of the measured changes or bias in the output of the magnetometer and the operation levels of the external payload hardware components to produce the magnetic interference model;
  means for executing the generated magnetic interference model using the obtained operation information to produce an estimated magnetometer bias; and
  means for adjusting an output of the magnetometer based, at least in part, on the estimated magnetometer bias.

23. The method of claim 3, wherein the external payload hardware components comprise one or more of an antenna, a camera, a motor, and a sensor.

24. The magnetometer system of claim 15, wherein the external payload hardware components comprise one or more of an antenna, a camera, a motor, and a sensor.

25. The drone of claim 16, wherein the external payload hardware components comprise one or more of an antenna, a camera, a motor, and a sensor.

* * * * *